United States Patent [19]

Philofsky et al.

[11] 4,454,529
[45] Jun. 12, 1984

[54] INTEGRATED CIRCUIT DEVICE HAVING INTERNAL DAMPENING FOR A PLURALITY OF POWER SUPPLIES

[75] Inventors: Elliott Philofsky, Myrtle Beach, S.C.; Ward Parkinson; Dennis Wilson, both of Boise, Id.

[73] Assignee: AVX Corporation, Great Neck, N.Y.

[21] Appl. No.: 339,490

[22] Filed: Jan. 15, 1982

Related U.S. Application Data

[63] Continuation-in-part of Ser. No. 224,127, Jan. 12, 1981.

[51] Int. Cl.³ .................... H01L 23/16; H01L 27/02; H01L 23/48; H01L 23/28
[52] U.S. Cl. ........................................ 357/75; 357/51; 357/70; 357/72; 357/80
[58] Field of Search ................... 357/70, 72, 75, 80, 357/51

[56] References Cited

U.S. PATENT DOCUMENTS

| | | | |
|---|---|---|---|
| 3,617,817 | 11/1979 | Kawakatsu et al. | 357/80 X |
| 3,866,311 | 2/1975 | Salles et al. | 357/51 X |
| 3,942,245 | 3/1976 | Jackson et al. | 357/70 X |
| 4,079,511 | 3/1978 | Grabbe | 357/70 X |
| 4,200,880 | 4/1980 | Frey | 357/80 X |
| 4,234,666 | 11/1980 | Gursky | 357/70 X |
| 4,249,196 | 2/1981 | Durney et al. | 357/80 X |
| 4,303,934 | 12/1981 | Stitt | 357/80 X |

Primary Examiner—Andrew J. James
Assistant Examiner—J. L. Badgett
Attorney, Agent, or Firm—Arthur B. Colvin

[57] ABSTRACT

The present invention is directed to an integrated circuit device comprising a lead frame having a ceramic capacitor mounted thereon and forming the support for a silicon chip bearing a multiplicity of circuits, including at least two power supply circuits namely a main power supply circuit and a secondary circuit. The capacitor is shunted across the terminals of the main power supply and the main power terminals of said IC chip. A conductive layer disposed atop the ceramic uppermost layer of the capacitor defines with the uppermost electrode of the capacitor, a second capacitive load of lesser value than the main capacitor, the said second capacitive load being shunted across the terminals of the secondary power supply and a secondary set of power terminals of said chip. The provision of internal capacitive shunting for the plurality of power supplies for the chip enables lead length to the capacitors to be maintained at a minimum thereby minimizing inductive reactance and thus enabling small capacitances to effectively dampen noise and pulses in the circuit.

5 Claims, 5 Drawing Figures

INTEGRATED CIRCUIT DEVICE HAVING INTERNAL DAMPENING FOR A PLURALITY OF POWER SUPPLIES

This invention is a continuation-in-part of copending application, Ser. No. 224,127, filed Jan. 12, 1981, and entitled integrated Circuit Device and Subassembly.

BACKGROUND OF THE INVENTION

1. Field of the Invention

The present invention is in the field of integrated circuit (IC) devices and particularly IC devices utilized as memory circuits.

2. The Prior Art

The use of IC devices particularly as components of memory circuits in computers and like applications is wide spread. As pointed out in the above referenced copending application, a frequent source of computer error occurs when one or more of the switching circuit elements of an IC are activated, with the creation of current and voltage transients. Such transients are injected into the power supply circuit or circuits as pulses, which in many instances may approach the characteristics of a functional signal. The generation of such functional signal renders it possible to obtain a false reading or transmission of inacurate information resulting in what is known in the industry as "soft error".

Conventionally, the transmission of pulses of error creating magnitude in the power supply circuit is avoided by placing in parallel with the circuit input a capacitor which dampens the pulses.

As noted in the above cited copending application, the length of the conductor running from the external dampening capacitor to the power supply terminals of the IC device is directly related to the amount of capacitance required for effective dampening. Where long external leads are utilized between the IC device and the dampening capacitor, the amount of capacitance necessary is far greater than is the case where, as per the copending application, the capacitor is physically embodied within the IC device and hence the leads between power supply terminals and the capacitor may be maintained at a very short length.

Other structures wherein attempts have been made to provide an IC device having an associated capacitor include, by way of example, U.S. Pat. Nos. 4,023,198, 4,105,475, 4,168,507, 4,208,698 and 4,249,196 and Japanese specification No. 53-121329.

SUMMARY OF THE INVENTION

The present invention may be summarized as directed to an improved lead frame type IC device characterized in that internal power supply dampening of a plurality of power supply circuits connected to the IC may be effected. In accordance with the invention a ceramic capacitor is connected to the lead frame both electrically and mechanically as per said copending application, the capacitor providing a mechanical mounting support for the IC chip. The ceramic capacitor is shunted across the power supply terminals using leads of minimal length. In order to provide pulsation dampening for a secondary power supply circuit, a second capacitor is formed by depositing a conductive electrode layer on the outer surface of the ceramic forming the casing of the capacitor, the external conductive additional electrode layer being in registry at least in part with the uppermost internal electrode of the capacitor. It will thus be seen that a secondary capacitor is created, with the uppermost internal electrode of the main capacitor and the externally deposited conductive layer defining the electrodes thereof and the casing or ceramic outer face of the capacitor defining the dielectric component thereof. The secondary capacitor, by virtue of the small lead length necessary to shunt the secondary power supply input of the IC device, is effective to dampen pulses in the secondary power supply not withstanding the relatively low capacitance generated.

It is accordingly an object of the present invention to provide an improved IC device comprising a lead frame having a ceramic capacitor defining an IC chip support platform as well as a principle shunting device for the main power supply, characterized in that there is defined between the uppermost electrode of the capacitor and a conductive coating superimposed over the outer face of the capacitor, a secondary capacitor for dampening a secondary power supply of the IC device, the dielectric material forming the casing surface of the capacitor forming the dielectric component of the secondary capacitor.

A still further object of the invention is the provision of an improved IC device of the type described wherein the provision of external power supply dampening capacitors for a plurality of circuits is obviated.

To attain these object and such further objects as may appear herein or be hereinafter pointed out reference is made to the accompanying drawings forming a part hereof, in which.

Figure 2:
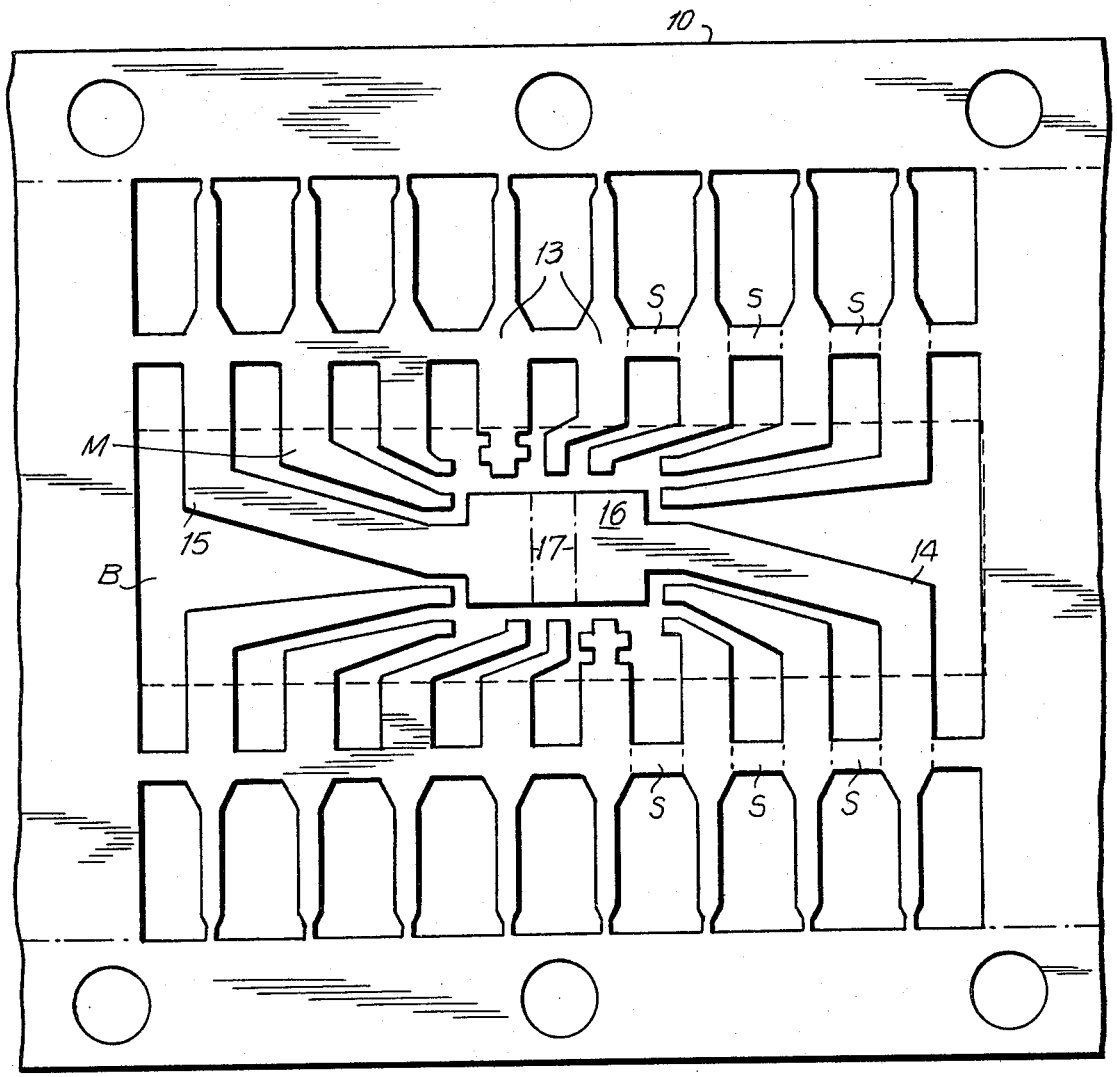
FIG. 2 is a magnified plan view of a section of a length of metal web material adapted to be fabricated into a lead frame for supporting the capacitor and IC chip.
Figure 5:
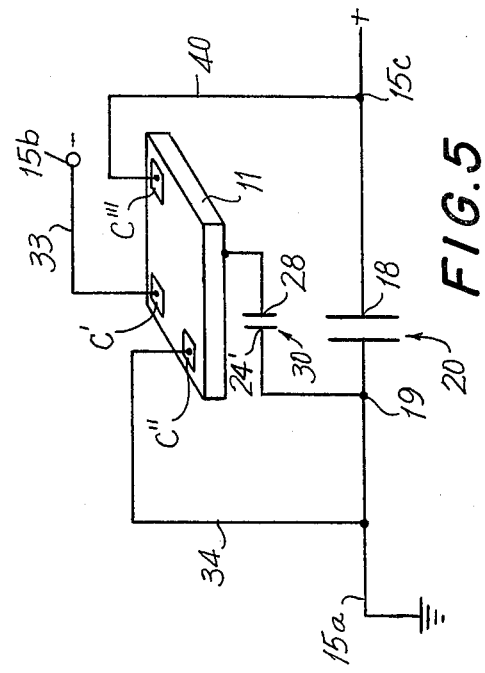
FIG. 5 is a schematic view of the circuit incorporating the IC chip and capacitor.

Referring now to the drawings there is shown in FIG. 2 a short section from an elongate web or band 10 of thin metal which has been punched or etched in a manner known per se to provide a plurality of blanked out areas B, the metal components M remaining between the blanked out portions B being employed to form conductors 15 for attachment at their innermost end to the contacts C of the circuitry formed within a semi-conductive silicon IC chip 11 known per se.

Figure 1:
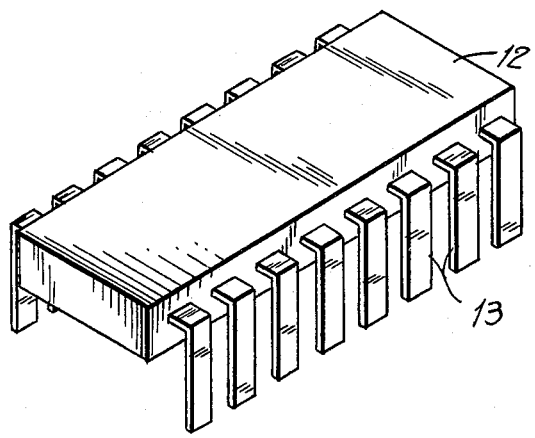
FIG. 1 is a perspective view of an IC device in accordance with the invention which is externally indistinguishable from conventional devices.

The finished IC chip which is conventional in appearance as is seen in FIG. 1 is encapsulated within a polymeric molded mass 12 and includes a plurality of outwardly and downwardly extending conductor portions 13, the distal ends of which are, in end use, electrically connected to complementarily spaced receptor sockets formed in a printed circuit board.

Figure 4:
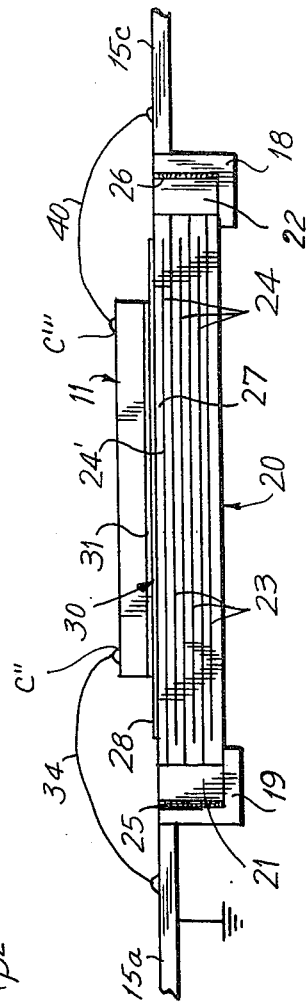
FIG. 4 is a vertical sectional view through the lead frame assembly and mounted IC chip.
Figure 3:
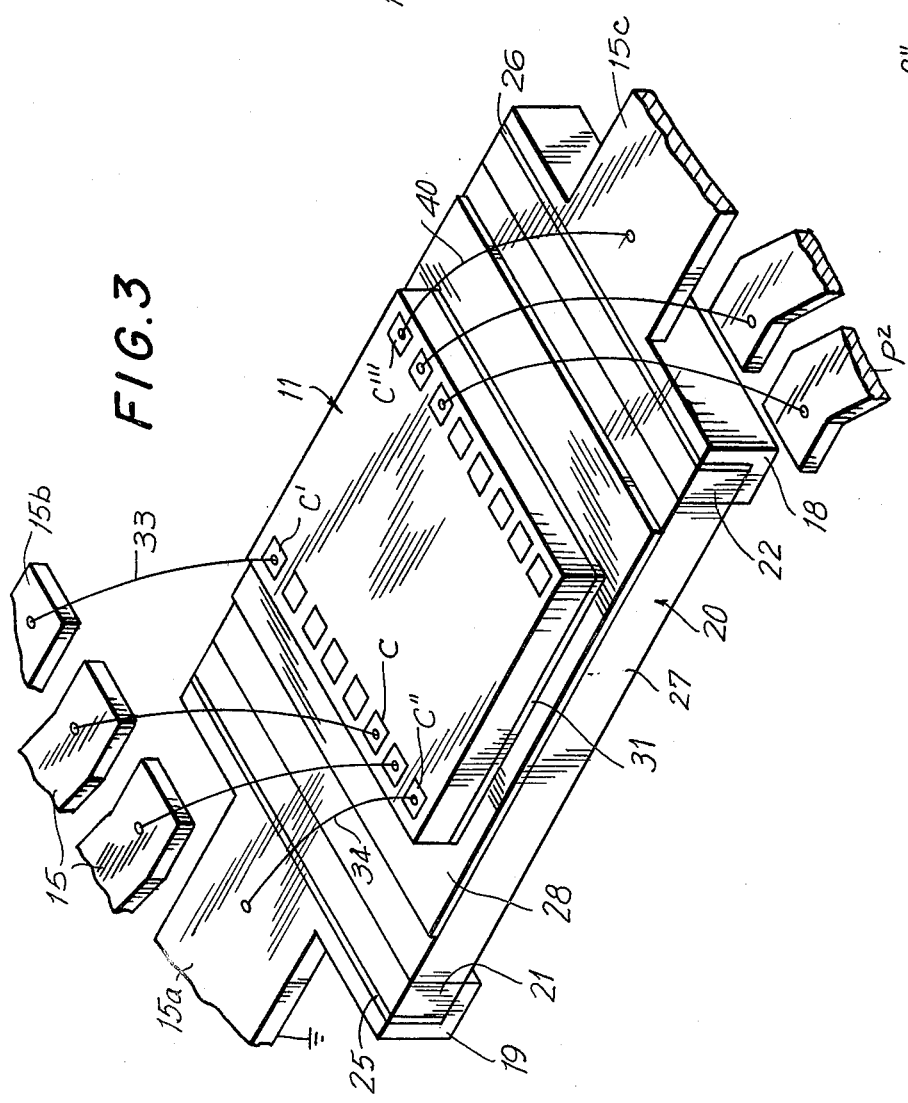
FIG. 3 is a fragmentary perspective view showing an IC device in accordance with the invention at an intermediate stage of production, namely prior to encapsulation.

Referring to FIG. 2 and, as more particularly pointed out in said above referenced copending application, the conductive portions 15 are initially integrally formed with a central metal pallet 16 which when severed along the lines 17—17 and subsequently folded as shown in FIGS. 3 and 4 forms support members 18, 19 upon which may be mounted the ceramic capacitor member 20.

The ceramic capacitor member 20, as is conventional, is formed with end terminations 21, 22 which terminations are respectively connected to the alternate electrode layers 23, 24 of the capacitor. As seen in FIGS. 3 and 4 solder termination portions 25, 26 mechanically and electrically secure the terminations 21, 22 respectively to the platforms 19 and 18 respectively.

As best seen from the FIGS. 3 and 4 the capacitor 20 includes an uppermost cover layer 27 which forms a portion of the encapsulation of the electrodes 23, 24. It will be understood that the layer 27 is formed of the same ceramic as the main body portion of the capacitor, and thus has a high dielectric coefficient. A conductive layer 28 of silver or like material is deposited atop the upper ceramic layer 27, the layer 28 being in at least partial registry with the uppermost electrode 24' within the body of the capacitor. It will thus be seen that the layer 24' within the capacitor and the silver or like conductive coating 28 define with the interposed ceramic layer 27 of the capacitor 20, a secondary capacitor of lower value than the capacitance provided by the capacitor 20. It will further be perceived that electrode 24' is connected via termination 21 and solder connection 25 to the support member 19 leading to conductor 15a. The capacitor formed by electrode 24', layer 27 and electrode 28 (such secondary capacitance being hereinafter referred to by the reference numeral 30) may be shunted across a second lower value power supply connected to the IC device to provide dampening against the transmission of pulses through the secondary power supply.

A preferred manner of effecting connection to the secondary capacitor 30 will be described hereinbelow, it being understood that alternate means for introducing the capacitance into the circuit will occur to those skilled in the art.

The IC chip member 11 which is formed of a semiconductive material illustratively silicon, is bonded to the conductive layer 28 forming the upper electrode of the capacitor 30 by a conductive bonding compound layer 31 illustratively a metal filled epoxy adhesive or the like. It will thus be perceived that the electrode 28 is electrically connected to the body of the semi-conductive chip 11 or, as desired, to a circuit component formed on the chip and exposed at the lower surface of the chip and hence in electrical contact with the layer 31.

Conductor 15b forming a part of the lead frame assembly is, by way of example, representative of the negative voltage of the secondary power supply. A jumper conductor 33 connects terminal 15b with contact C', the latter being the secondary input power supply contact to the chip 11. The ground source to the internal circuit in the IC serviced by the secondary power supply is from ground conductor 15a of the lead frame assembly connected by jumper 34 to contact C''. As previously noted, contact between the electrode 24' of the auxiliary capacitor 30 is effected to ground terminal 15a through end termination 21 and member 19. The conductive layer 28 which forms an electrode of capacitor 30 is connected by a direct internal circuit path within the chip to contact C'. It will be thus observed that the auxiliary capacitor 30 is shunted across the secondary power supply input connected between conductor 15b of the lead frame assembly and ground conductor 15a. The main capacitor 20 has its end termination 22 connected to platform 18 of the lead frame assembly which has a conductor member 15c connected to the positive side of the main power supply and by jumper 40 to positive contact C''' of the IC chip 11. The end termination 21 of the main capacitor is connected to platform 19 which has ground conductor member 15 a connected thereto. Thus the main capacitor 20 is shunted across the IC chip and the main power supply.

The remaining jumper connections are in the usual manner effected between the various lead frame conductors 15 and contacts C of the IC chip device.

After the desired connections have been effected and in the usual manner, the blank portions S connecting adjacent conductor members 15 are severed, so as to electrically isolate the various conductor members 15. After the conductor members have been isolated and the boundary portions of the lead frame removed, the conductors are bent to the final configuration as illustrated at 13 in FIG. 1 and encapsulated in polymeric mass 12.

The completed IC assembly is now ready for use. It will be recognized from the preceeding description that the IC assembly incorporates a capacitor member which forms a support platform for the semi-conductor chip. The upper dielectric surface of the capacitor is used in combination with a desposited external electrode layer to define a secondary capacitance with the uppermost internal electrode layer of the capacitor. There is thus provided at no consequential increase in expense an IC chip device having two capacitive components namely a major capacitor adapted to be shunted across the main power supply terminals to the device and a secondary or minor capacitor defined by the dielectric upper layer of the capacitor, the uppermost internal electrode of the capacitor and the deposited external metallic electrode layer.

As will be apparent from the preceeding description numerous variations in the described structure may be made without departing from the spirit of the invention. More particularly the principal contribution of the present invention is considered to reside in the provision of the combination of lead frame, a ceramic capacitor embodied in the lead frame as a support for an IC chip, and in the utilization of the upper dielectric surface of the supporting capacitor in combination with an externally deposited electrode and an uppermost inner electrode to provide two distinct capacitances for shunting two power supply inputs to prevent the transmission of switching transients throughout the circuit. The specific means of effecting electrical connection to the capacitances which have been illustrated should be viewed as examples only and should not be considered limitative of the manner in which such connections may be effected. Similarly, it is within the purview of the present invention to provide additional capacitances by electrically isolating the deposited external metallic layer whereby each isolated portion of the deposited layer forms a separate capacitance with the registering components of the underlying uppermost electrode of the main capacitor. Accordingly, the invention is to be broadly construed within the scope of the appended claims to encompass variations of the type set forth.

The embodiments of the invention in which an exclusive property or privilege is claimed are defined as follows:

1. In an integrated circuit device comprising in combination a mass of polymeric insulating material, a lattice work of metal formed from an integral web embedded in said mass, said lattice work including a plurality of conductor members having portions disposed in coplanar alignment within said mass, said conductor members including contact portions extending outwardly of said mass, the improvement comprising a pair of said conductor members within said mass having spaced inner terminal ends defining a support platform including a pair of spaced mounting portions displaced from the plane of said coplanar portions of said conductor members (portions), said pair of conductor members and the associated mounting portions being adapted to be connected across a first power supply, an additional one of said conductor members and one of said pair of conductor members being adapted to be connected across a second power supply, a capacitor having a pair of electrode terminations supported respectively on said spaced mounting portions and in electrical contact therewith, said capacitor having a generally planar upper surface layer portion formed of dielectric material, the uppermost surface of said layer defining an exposed face, said exposed face of said layer defining a mounting area, said capacitor including an internal upper electrode in parallel spaced relation to said mounting area and connected to one of said electrode terminations whereby it is electrically connected to the associated mounting portion, a conductive layer member on said exposed face in registry with at least a part of said upper electrode, an IC chip of semi-conductive material mounted over said conductive layer, said chip including a first and second pair of power supply inputs, a first pair of circuit conductor means respectively electrically connecting each of said first pair of power supply inputs with a respective one of said pair of conductor members, whereby said capacitor is shunted across said first power supply, another circuit conductor means electrically connecting said additional one of said conductor members with one of said second pair of power supply inputs of said IC chip, whereby there is formed in shunting relation of said second power supply and said second pair of power supply inputs a capacitive load defined by said upper electrode, said surface layer of said capacitor and said conductive layer member.

2. An integrated circuit device in accordance with claim 1 and including a conductive bonding layer interposed between said IC chip and said conductive layer member of said capacitor, said bonding layer securing said chip to said conductive layer member.

3. An integrated circuit in accordance with claim 2 wherein portions of said semi-conductive chip form a continuation of the conductive path between said bonding layer and said additional one of said conductor members.

4. As an article of manufacture, a lattice work of metal including a plurality of conductor members, a pair of said conductor members having spaced end portions, a capacitor having a dielectric body portion, said capacitor including a planar dielectric surface area and internal mutually spaced electrodes, one of said electrodes being disposed in parallel spaced relation to said planar surface area, said capacitor having end terminations mechanically supported by said spaced end portions and electrically connected thereto and to alternate spaced electrodes, and a layer of conductive material on said surface area of said capacitor, said layer defining a second capacitor with respect to said one of said electrode.

5. An article in accordance with claims 4 in which an IC chip member of semi-conductive material is mounted over said layer of conductive material, said chip member having at least two pairs of power supply inputs, first conductor means connecting the power supply inputs of one said pair to a respective internal electrode and second conductor means connecting the power supply inputs of said second pair respectively to said one electrode and said conductive layer.

* * * * *

UNITED STATES PATENT OFFICE
CERTIFICATE OF CORRECTION

PATENT NO. : 4,454,529
DATED : June 12, 1984
INVENTOR(S) : ELLIOTT PHILOFSKY and WARD PARKINSON and DENNIS WILSON It is certified that error appears in the above-identified patent and that said Letters Patent are hereby corrected as shown below:

In Claim 1 of the Patent, line 13 after "members" (first occurrence) cancel "(portions)"

Signed and Sealed this

Eleventh Day of December 1984

[SEAL]

Attest:

GERALD J. MOSSINGHOFF

*Attesting Officer*   *Commissioner of Patents and Trademarks*